United States Patent
Nguyen

(10) Patent No.: US 7,558,798 B2
(45) Date of Patent: *Jul. 7, 2009

(54) METHOD AND APPARATUS FOR BATTERY POWER PRE-CHECK AT SYSTEM POWER-ON

(75) Inventor: Don J. Nguyen, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 465 days.

This patent is subject to a terminal disclaimer.

(21) Appl. No.: 10/727,231

(22) Filed: Dec. 2, 2003

(65) Prior Publication Data

US 2004/0113496 A1 Jun. 17, 2004

Related U.S. Application Data

(63) Continuation of application No. 09/162,643, filed on Sep. 29, 1998, now Pat. No. 6,664,792.

(51) Int. Cl.
*G06F 17/30* (2006.01)

(52) U.S. Cl. ....................... 707/100; 455/572

(58) Field of Classification Search ............... 707/104.1, 707/100; 455/572; 322/59
See application file for complete search history.

(56) References Cited

U.S. PATENT DOCUMENTS

| | | | |
|---|---|---|---|
| 4,258,999 A | 3/1981 | Tominaga | |
| 4,547,770 A | 10/1985 | Suzuki et al. | |
| 4,639,657 A * | 1/1987 | Frierdich | ...................... 322/59 |
| 4,645,943 A | 2/1987 | Smith et al. | |
| 4,730,121 A | 3/1988 | Lee et al. | |
| 5,027,294 A | 6/1991 | Fakruddin et al. | |
| 5,243,577 A | 9/1993 | Ueda et al. | |
| 5,543,245 A | 8/1996 | Andrieu et al. | |
| 5,557,188 A | 9/1996 | Piercy | |
| 5,557,365 A | 9/1996 | Ohsawa | |
| 5,602,797 A * | 2/1997 | Kang | ..................... 365/230.06 |
| 5,604,708 A | 2/1997 | Helms | |
| 5,650,974 A | 7/1997 | Yoshimura | |
| 5,689,412 A | 11/1997 | Chen | |
| 5,744,962 A | 4/1998 | Alber et al. | |
| 5,747,189 A | 5/1998 | Perkins | |
| 5,969,529 A | 10/1999 | Eiraku et al. | |
| 5,987,613 A | 11/1999 | Busch et al. | |
| 6,144,976 A | 11/2000 | Silva et al. | |
| 6,167,289 A * | 12/2000 | Ball et al. | ..................... 455/572 |
| 6,177,957 B1 | 1/2001 | Anderson | |
| 6,202,171 B1 | 3/2001 | Townsley | |
| 6,204,573 B1 | 3/2001 | Gree et al. | |

(Continued)

OTHER PUBLICATIONS

Texas Instruments/Unitrode, U-514 Using the bq2010: A Tutorial for Gas Guaging, Dec. 1993.

(Continued)

*Primary Examiner*—Etienne P LeRoux
(74) *Attorney, Agent, or Firm*—Matthew C. Fagan

(57) ABSTRACT

A system including at least one electronic component and a battery check circuit. When a power consumption level of the at least one electronic component is increased, the battery check circuit determines whether to provide power from a battery to the at least one electronic component by comparing a power level of the battery to a first power level.

23 Claims, 5 Drawing Sheets

U.S. PATENT DOCUMENTS 6,298,104 B1 10/2001 Saeki
6,405,049 B2 6/2002 Herrod et al.
6,415,391 B1 7/2002 Naka

OTHER PUBLICATIONS

Smart Battery Charger Specification, Rev. 1.0, Jun. 27, 1998, Copyright 1996, Benchmarq Microelectonics, Inc., All Rights Reserved.

Duracell Intel Smart Battery Data Specification, Rev. 1.0, Feb. 15, 1995, Release A, Copyright 1993, 1994, 1995, Duracell, Inc., Intel Corporation, All Rights Reserved.

Smart Battery Selector Specification, Rev. 1.0, Sep. 5, 1996, Copyright 1995, Benchmarq Microelectronics, Inc. et al. All Rights Reserved.

* cited by examiner

METHOD AND APPARATUS FOR BATTERY POWER PRE-CHECK AT SYSTEM POWER-ON

CROSS REFERENCES TO RELATED APPLICATIONS

This is a continuation of application Ser. No. 09/162,643, filed Sep. 29, 1998, now U.S. Pat. No. 6,664,792.

BACKGROUND OF THE INVENTION

1. Field of the Invention

The present invention pertains to the field of portable computing devices. More particularly, the present invention relates to testing batteries to determine whether power should be supplied to particular components when an attempt is made to fully or partially enable or otherwise increase the power consumption of the system.

2. Description of Related Art

Many portable computing or other electronic devices are powered by batteries. Inevitably, unless charged, such batteries discharge and are no longer able to maintain operation of their host device. Users, however, often attempt to turn on their portable electronic devices either because they are unaware of the fact that the batteries are discharged or in an attempt to obtain additional operation from the failing batteries.

Unfortunately, failing batteries may cause problems for some electronic devices. For example, some electronic devices contain components which do not function properly when insufficient power is supplied. As a result, certain operations may be performed inaccurately and/or data may be corrupted. Even worse, other components may be damaged when insufficient battery power is available.

In general, some prior art devices detect and react to low battery power. In particular, prior art portable computer systems often utilize hardware such as a System Management Controller (SMC) which communicates with various system batteries and components over a System Management Bus (SMBus) to manage power consumption. Further details regarding the SMBus protocol are available in the SMBus Specification, Revision 1.0, Feb. 15, 1995, available from the Smart Battery System Implementer's Forum (on the Internet at the time of filing of this application at www.sbs-forum.org).

Prior art computer systems typically only monitor batteries during normal operation. Such systems use the SMBus or other power control hardware in warning the user of low battery power and/or shutting down the system if needed. Additionally, some systems switch between primary and secondary battery supplies during normal operation and even temporarily resort to using a back-up battery to shut down the system in an orderly fashion to avoid the loss of data.

The prior art does not, however, provide a technique which performs a pre-check of battery levels. That is, the prior art does not test power levels of the batteries which would otherwise supply power to electronic components before such batteries are allowed to power such electronic components. Consequently, it would be possible for an improperly charged (i.e., overcharged or undercharged) battery to damage such components.

BRIEF DESCRIPTION OF THE FIGURES

The present invention is illustrated by way of example and not limitation in the Figures of the accompanying drawings.

DETAILED DESCRIPTION

The following description provides a method and apparatus for battery power pre-check at system power-on. In the following description, numerous specific details such as types of portable electronic devices, battery test logic implementation, and logic partitioning/integration choices are set forth in order to provide a more thorough understanding of the present invention. It will be appreciated, however, by one skilled in the art that the invention may be practiced without such specific details. In other instances, control structures and gate level circuits have not been shown in detail in order not to obscure the invention. Those of ordinary skill in the art, with the included descriptions, will be able to implement the necessary logic circuits without undue experimentation.

The disclosed apparatus and method may advantageously protect components or data in a portable computer system or other battery powered electronic device. This protection involves the use of a battery check circuit which determines whether power from a battery should be applied to one or more components by testing a power level of the battery. In some embodiments, a back-up battery may be used to temporarily power the battery check circuit and/or system components while the test is performed. The battery check circuit may prevent power from being supplied to other components and shut down the battery check circuit itself if insufficient power is available to adequately power the system.

Figure 1:
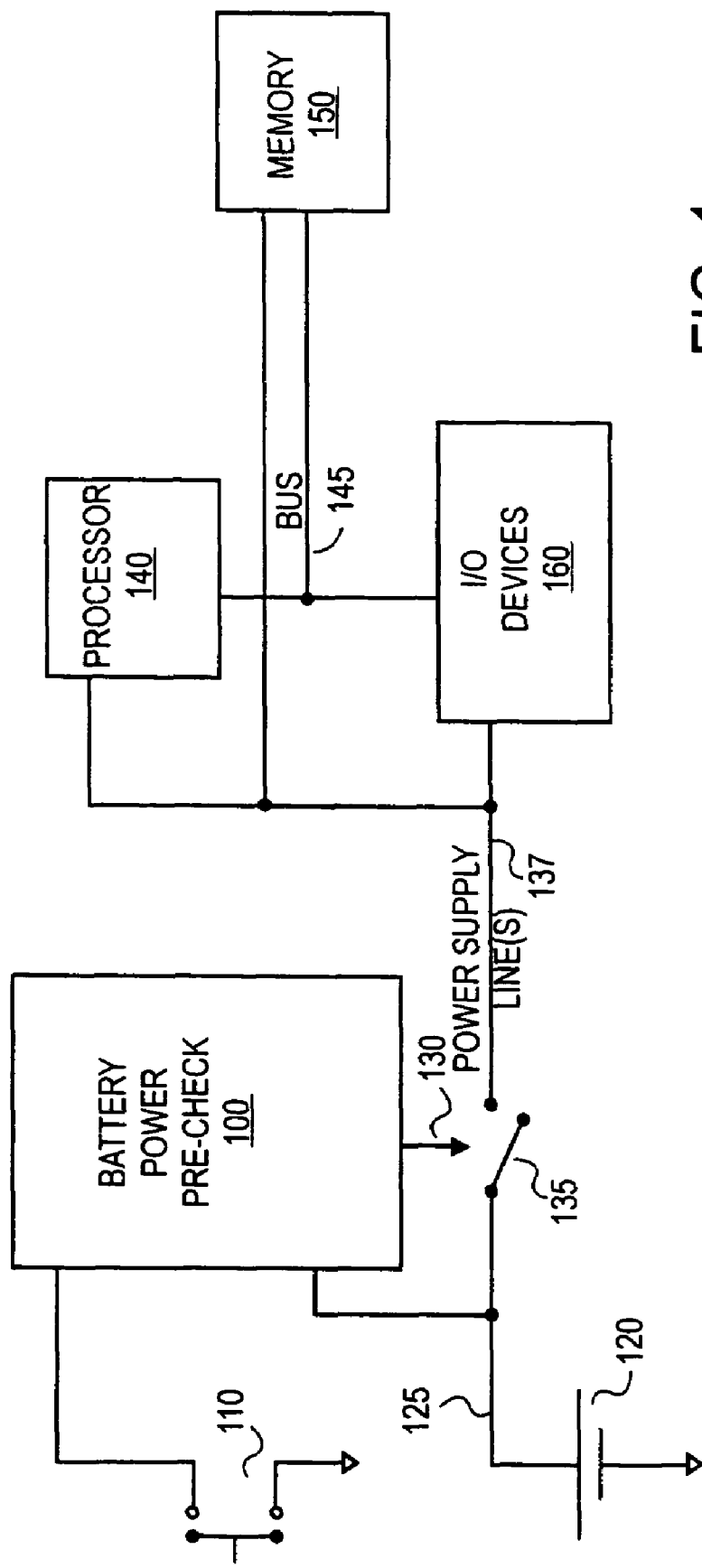
FIG. 1 illustrates one embodiment of a system utilizing a battery power pre-check circuit.

FIG. 1 illustrates one embodiment of a system utilizing a battery check circuit 100. The system may be a laptop or notebook computer, a personal digital assistant, as well as any other type of portable electronic component which is capable of operating on battery power. The illustrated system includes a processor 140, a memory 150, and input/output (I/O) device(s) 160. The processor 140, the memory 150, and the I/O devices 160 receive power via one or more power supply line(s) 137, and transfer information over a bus 145. Many other types and/or combinations of components may be used in a system in combination with the battery check circuit 100.

The battery check circuit is coupled to an on/off switch 110. In a laptop computer this may be a push-button switch which, when temporarily depressed, indicates that the user wishes to power-on the system. In other embodiments, the power-on may be accomplished by other sensing or mechanical mechanisms. For example, opening the lid of a portable device may be used to signal that the device should be enabled. Alternatively, writing on a touch-pad or moving a mouse, or many other types of stimulus could be received by the battery check circuit 100 to signal system power-on.

Figure 2:
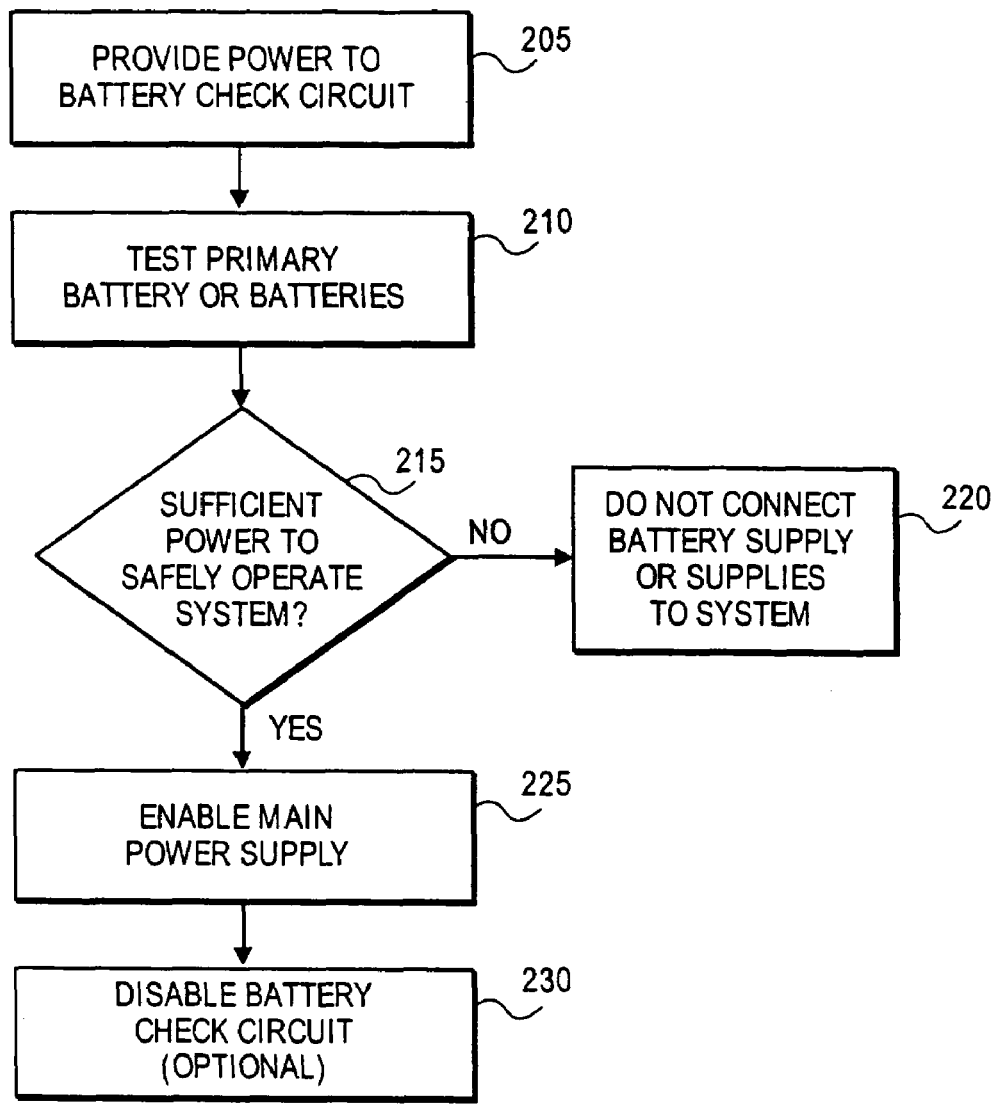
FIG. 2 illustrates one embodiment of a method for determining whether to provide power to system components using a battery check circuit.

A sequence of operations which may commence with system power-on is illustrated in FIG. 2. This sequence of operations may be used in some embodiments at times other than power-on when a change in the power consumption level of the system changes. For example, such a sequence may be employed when the system is awakened from a low power state or at other times when a significant change in power consumption is about to occur.

As illustrated in FIG. 1, a battery 120 is connected to a power supply line 125 to the battery check circuit 100. As indicated by step 205, the battery check circuit typically needs power to perform the battery check. In some embodiments, the battery check circuit 100 is powered by a back-up battery (not shown); however, in other embodiments the battery check circuit may be able to receive sufficient power from the battery 120.

As illustrated in step 210, the battery check circuit tests the primary battery or batteries. In the case of FIG. 1, the battery 120 is tested. The battery check circuit 100 may perform a variety of checks on the battery 120. For example, the battery check circuit 100 may determine whether the battery 120 has sufficient power to supply the processor 140 and other components with the proper voltage and/or current level.

Alternatively, the battery check circuit 100 may perform tests to make sure that the battery 120 will not supply too high of a voltage for the components. In general, the battery check circuit may perform any of a variety of tests which may determine whether the battery 120 may be safely applied to the components without jeopardizing either the components themselves, operation of other components, or any information stored in the system. If the battery 120 fails the test performed by the battery check circuit 100 in step 215, the battery check circuit 100 has determined that there is an unacceptably high risk of malfunction or damage and therefore the battery check circuit 100 does not connect the battery 120 to the system as shown in step 220.

If the battery check circuit 100 determines that sufficient power is available to safely operate the system in step 215, the switch 135 is closed and the battery is connected to power supply line(s) 137 enabling the main power supply as shown in step 225. Typically, the switch 135 is an electrically actuated switch. In addition to the switch 135, there may be a direct current (DC) to DC converter, a voltage regulator, or other circuitry which is enabled by the power check circuit 100 (as part of the process of enabling the main power supply) to ensure an appropriate supply voltage to the processor 140 and other components.

In some embodiments, the battery 120 itself generates an appropriate voltage for the components, and there may be no need for extensive power regulation and conversion devices, thereby making the role of the battery power check circuit 100 even more important for protecting the components. In such cases, the main power supply may be enabled simply by closing the switch 135 to supply power to the system components, although some form of power filtering (active or passive) will typically be employed as well.

After the main power supply is enabled and the components receive power, the battery check circuit 100 may be disabled as shown in step 230. This step, however, is an optional way to save power. Instead, the battery check circuit 100 may be left on or may play an active role as the system transitions between various power levels.

Figure 3:
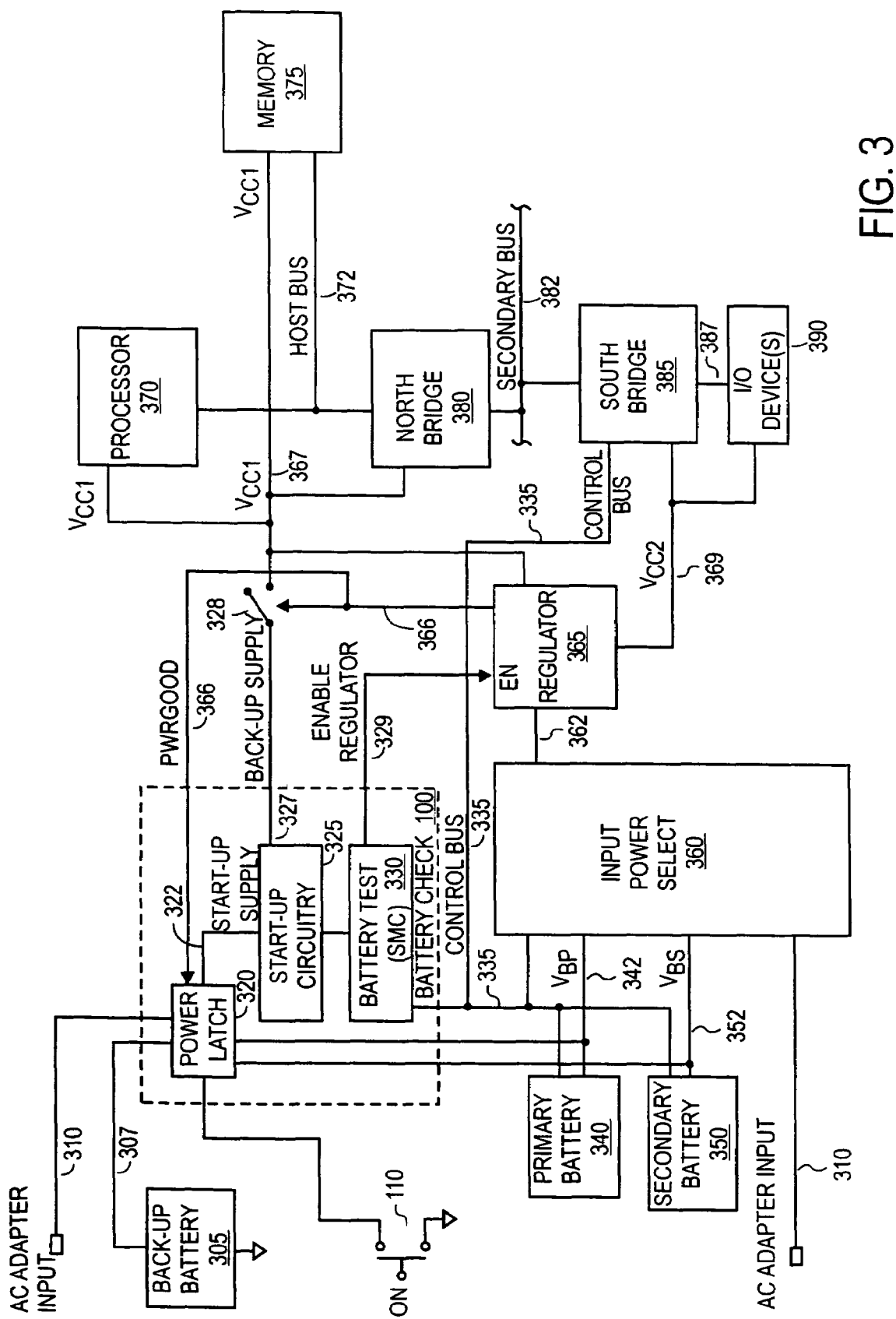
FIG. 3 illustrates one embodiment of a computer system which includes a battery check circuit which may determine whether either a primary battery or a secondary battery has sufficient power for the computer system.
Figure 4:
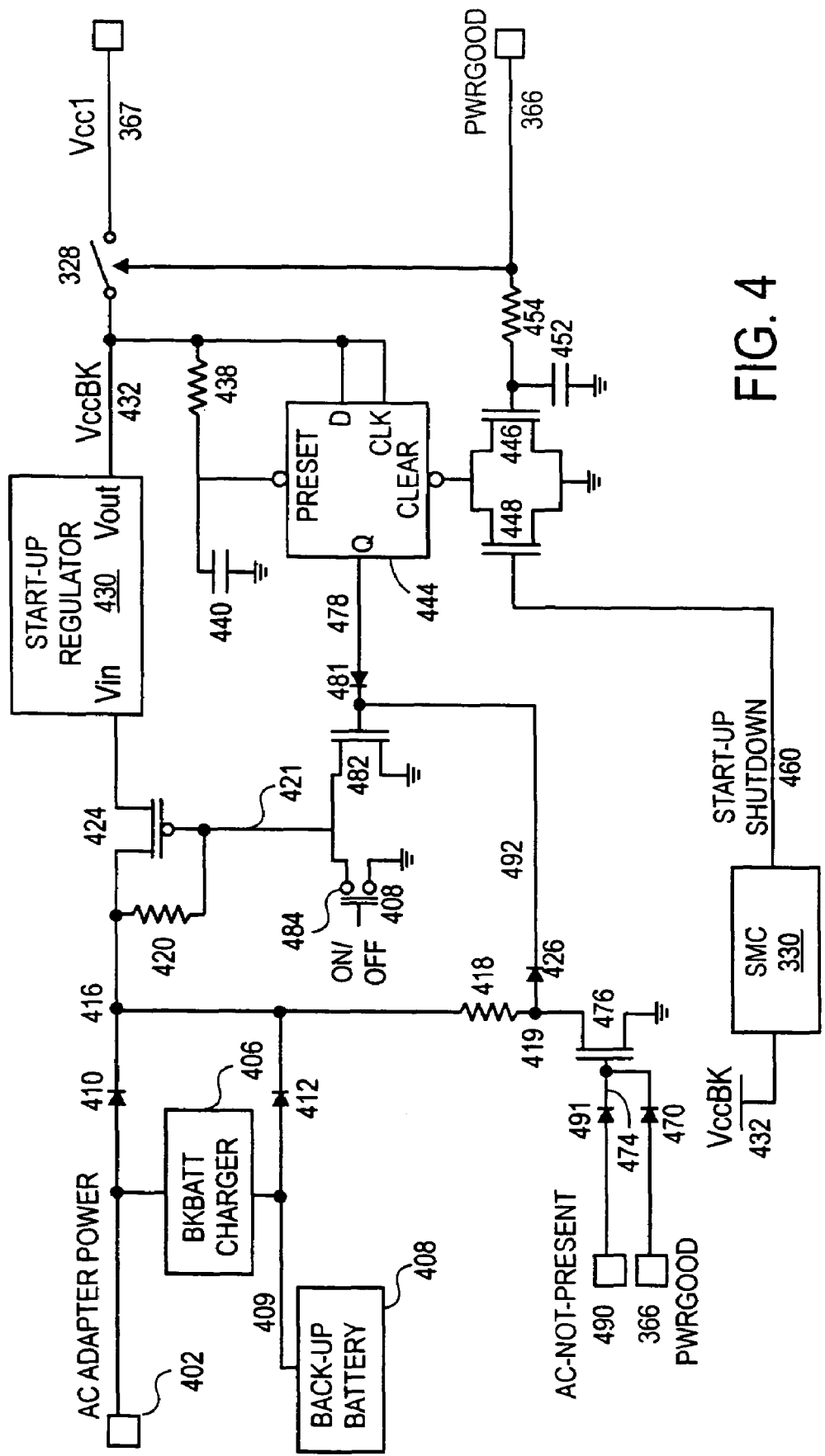
FIG. 4 illustrates details of one embodiment of the battery check circuit which may be used in the computer system illustrated in FIG. 4.
Figure 5:
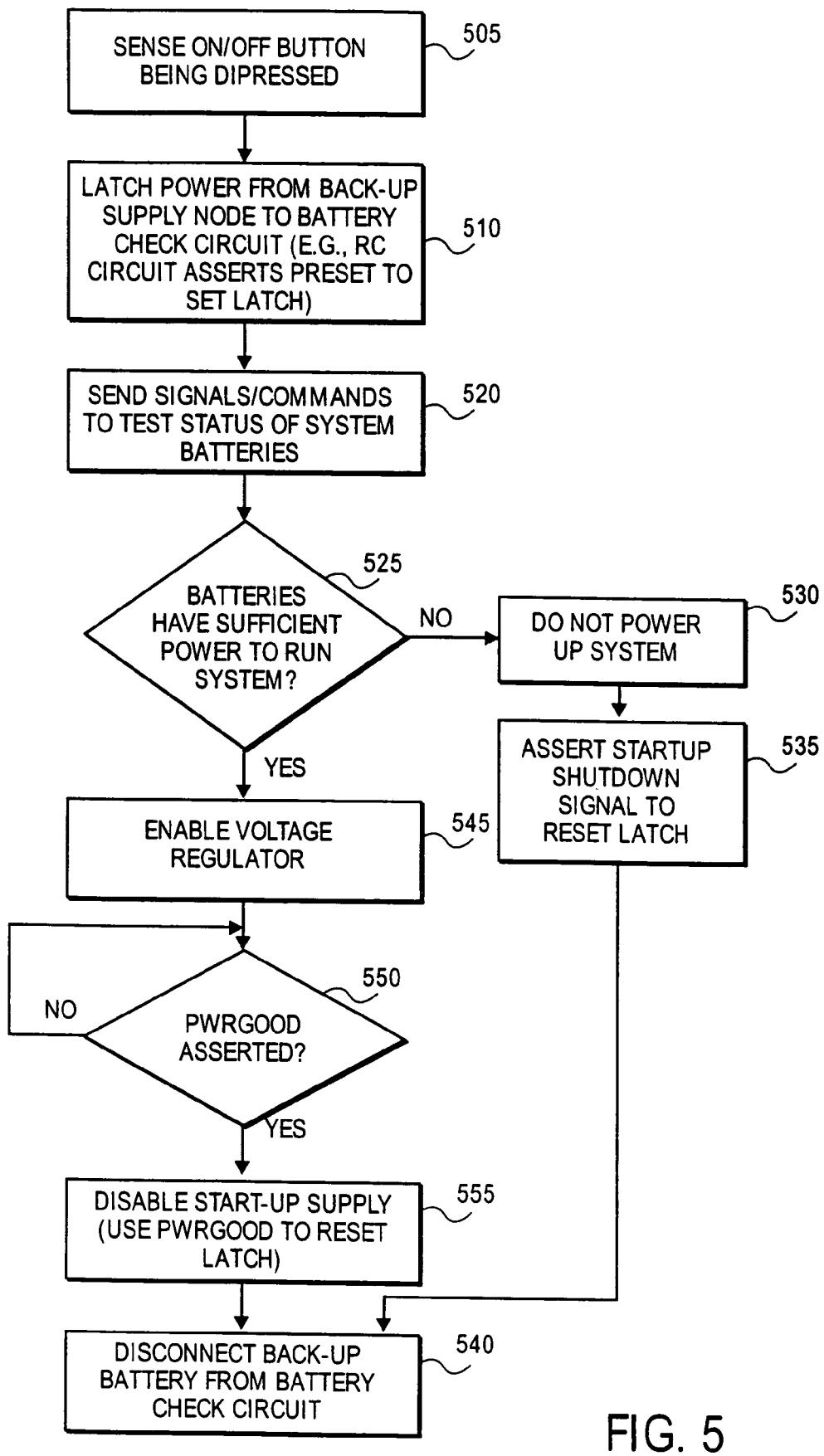
FIG. 5 illustrates one embodiment of a process performed at system power-on for a system such as one utilizing components in FIGS. 3 and 4.

FIGS. 3 and 4 illustrate details of one embodiment of a portable computer system which utilizes a battery check circuit 300 at system power-on. In FIG. 3, the top level system schematic is shown, whereas FIG. 4 illustrates additional details of one embodiment of the battery check circuit 300 and associated components. FIG. 5 illustrates an associated sequence of operations for one embodiment.

The system of FIG. 3 includes various computer system components as well as the battery check circuit 300. The battery check circuit 300 is powered either by a back-up battery 305 via a supply line 307 or by power from an alternating current (AC) adapter input provided on a supply line 310. If power is available from the AC adapter input, it may not be necessary to check the status of the power from system batteries. For the remainder of the discussion of this embodiment, unless otherwise specified, it is assumed that power is not available from the AC adapter input.

The components illustrated in FIG. 3 include a processor 370, a memory 375, a north bridge 380, a south bridge 385, and I/O device(s) 390. The processor 370, memory 375, and north bridge 380 communicate via a host bus 372, and all of these components are powered by Vcc1 on a supply line 367. The south bridge 385 is coupled to the north bridge 380 via a secondary bus 382, to a control bus 335, and to the I/O device(s) 390 by a bus 387. The south bridge 385 and the I/O device(s) 390 are shown as being powered by a second voltage supply line 369 (Vcc2). This configuration is only an exemplary arrangement in which the presently disclosed techniques may be used. Many other arrangements of components (or even a single component) may benefit from the use of battery check circuitry.

When the on/off switch 110 is depressed, a power latch 320 senses a momentary impulse from the on/off switch 110 as indicated in step 505 of FIG. 5. The power latch 320 latches a value such that power from the back-up battery 305 (and/or the primary battery 340 and the secondary battery 350 if sufficiently charged) is provided on a start-up supply line 322 as indicated in step 510. A start-up circuit 325 receives power via the start-up supply line 322 and provides a back-up supply voltage on supply line 327.

A PWRGOOD signal on a signal line 366 controls a switch 328 and initially opens the switch 328, thereby only providing the back-up supply voltage to the battery check circuit 100 during system startup. The entire system typically first receives power when its main supply is enabled.

Step 510 also indicates that in one embodiment the latch may operate by utilizing a resistive-capacitive (RC) timing circuit to assert a preset input. This technique is used in the embodiment of the battery check circuit shown in FIG. 4. In the embodiment of FIG. 4, either AC adapter power on a supply line 402, DC power from the primary or secondary battery (not shown), or a back-up battery 408 may supply power during this initial start-up phase. When external AC power is available, that power not only supplies power for the system, but also recharges the back-up battery via a battery charger 406.

An AC-NOT-PRESENT signal 490 (when asserted low) indicates that AC adapter power on the supply line 402 is present with sufficient voltage. In conjunction with a diode 491, the AC-NOT-PRESENT signal therefore turns off the N channel transistor 476 by producing a low value at its gate. Node 419 is pulled up approaching the voltage on node 416. The diode 426 is forward biased providing a high logic level at the gate of N channel transistor 482. With transistor 482 turned on, the P channel transistor 424 is enabled, and power is supplied to the start-up regulator 430 which generates Vccbk at that time.

The back-up battery 408 is coupled via a supply line 409 and a diode 412 to a node 416. The AC adapter power is similarly coupled to node 416 via the supply line 402 and a protection diode 410. Although not shown in FIG. 4, the primary battery and the secondary battery are similarly coupled by diodes to provide power at node 416. Thus, node 416 receives power at any time that any power source is available. Since the backup battery 408 usually has a lower voltage than the primary battery and the secondary battery, the backup battery 408 will usually not be discharged due to the diode arrangement. When an on/off switch 484 is depressed, a connection is made between node 416 and ground through a resistor 420 which is connected between node 416 and node 421.

A P-channel transistor 424 having a source connected to node 416, a drain connected to a Vin terminal of a start-up regulator 430, and a gate connected to node 421. Due to the closing of the switch 484, the transistor 424 begins conducting due to the voltage drop across the resistor 420. Accordingly, the start-up regulator 430 receives the voltage supplied at node 416 and produces a voltage Vccbk at its output Vout which is connected to a supply line 432. Thus, even if the primary battery or batteries have insufficient power, the battery check circuit and the Vccbk rail are powered by the backup battery.

The Vccbk power supply is provided at the data (D) and clock (CLK) inputs of a latch 444. Vccbk is also provided to the preset input of the latch 444 through an RC circuit formed by a capacitor 440 and a resistor 438. The RC circuit keeps the preset input asserted as power ramps on supply line 432, thereby ensuring that the latch output (Q) is set to drive a logical one on node 478. The logical one on node 478 enables an N-channel transistor 482 which provides a connection from node 416 to ground through the resistor 420. Accordingly, when the switch 484 is released, the enabled transistor 482 keeps the gate of the transistor 424 at a low voltage level such that power from the back-up battery is latched as indicated in step 510.

Referring back to FIG. 3, after the power supply for the battery check circuit 300 is latched, a battery test circuit 330 sends signals over the control bus 335 effectuating a test of a primary battery 340 and/or the secondary battery 350 as indicated in step 520. In one embodiment, the battery test circuit 330 may be a part of a system management controller (SMC) and the control bus may be a System Management Bus (SMBus) which operates in accordance with the SMBus Specification mentioned in the background section of this disclosure. In this embodiment, the primary battery 340 and the secondary battery 350 are "smart batteries" which are capable of receiving and responding to commands such as power level testing commands over the control bus 335. Additionally, the SMC itself may be powered by the back-up battery via the power supply line 432 (Vccbk) as shown in FIG. 4. Alternatively, other types of control interconnections and signaling conventions may be used for communications with and testing of the batteries and the battery check circuit.

A voltage or power level value is returned to the battery test circuit 330 from one or both of the primary battery 340 and the secondary battery 350 and compared to a predetermined value to determine if the batteries have sufficient power to run the system at the new power level as indicated in step 525. Alternatively, other tests or comparisons may be performed which detect whether the tested battery can power the system without causing malfunction or damage.

If insufficient power is available from both the primary battery 340 and the secondary battery 350, the battery check circuit 300 does not power up the system as indicated in step 530. Referring to the detailed schematic of FIG. 4, in response to the insufficient power being available, the SMC 330 asserts a START-UP SHUTDOWN signal on a signal line 460 as shown in step 535. The START-UP SHUTDOWN signal is connected to the gate of an N-channel transistor 448 and connects a clear input of the latch 444 to ground in response to the assertion of the START-UP SHUTDOWN signal, thereby resetting the latch 444 to zero.

In response to the logical zero on node 478, the transistor 482 is disabled, resulting in the transistor 424 being shut off. Consequently, the back-up battery 408 and all other battery power is disconnected from the start-up regulator 430 and the POWERGOOD signal will not be asserted to close the switch 328. In FIG. 3, the battery check circuit 300 does not assert an ENABLE REGULATOR signal on the signal line 329. Thus, the detection of insufficient battery power prevents the entire system from operating and prevents power from the primary and secondary batteries from being provided to any system components. Finally, the back-up battery may be disconnected from the battery check circuit 300 and any other system components as indicated in step 540.

If either battery has sufficient power for the system, the battery check circuit 300 may assert the ENABLE REGULATOR signal on a signal line 329 as indicated in step 545. The battery check circuit 300 may also pass commands indicating which battery to select to an input power select circuit 360. The input power select circuit 360 is coupled to select, as a supply voltage for a voltage regulator 365, one of the primary battery output voltage (Vbp) on a supply line 342, the secondary battery output voltage (Vbs) on a supply line 352, and the AC adapter input on the supply line 310. In response, the input power select circuit 360 provides power from the appropriate source to the regulator via a supply line 362.

When the regulator 365 achieves stable supply voltages Vcc1 on the supply line 367 and Vcc2 on a supply line 369, the PWRGOOD signal is driven on signal line 366 as shown in step 550. Referring to FIG. 4, assertion (to a logical high value) of the PWRGOOD signal closes the switch 328 rapidly and more slowly resets the latch 444 such that the switch 328 is closed before power to the startup regulator is disabled by turning off transistor 424.

To achieve the proper sequencing, a resistor 454 and a capacitor 452 are connected to form an RC circuit which provides a delay before a gate input of an N-channel transistor 446 is reaches a logical high level. The logical high level at the gate of the transistor 446 enables that transistor, and clears the latch 444 as indicated in step 555. As previously, resetting the latch disconnects the back-up battery from the start-up circuit 430 as indicated in step 540. Vccbk remains powered by the Vcc1 rail through the closed switch 328 so that the SMC 330 may continue to operate without draining the backup battery 408.

Additionally, when the PWRGOOD signal is asserted, it passes through a diode 470 to node 474. The PWRGOOD signal asserted (logical high value) enables an N-channel transistor 476. Accordingly, transistor 482 turns off, and power may not continue to pass through transistor 424. Thus, the back-up supply node 416 is disconnected from the battery check circuit 300 and normal operation commences.

A method and apparatus for battery power pre-check at system power-on has been disclosed. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art upon studying this disclosure.

What is claimed is:

1. A system comprising:
   at least one electronic component;
   a back-up battery to provide a back-up voltage supply on a back-up supply node;
   a battery check circuit to be powered by the back-up voltage supply and to determine, in response to an attempt at system power-on, whether to provide power from a battery different than said back-up battery to the at least one electronic component by comparing the battery's power level to a predetermined power level.

2. The system of claim 1 wherein the battery check circuit provides power from the battery to the at least one electronic component if the battery power level is at least the predetermined power level and wherein the battery check circuit prevents the battery from providing power to the at least one electronic component if the battery power level is less than the predetermined power level.

3. The system of claim 1 wherein the predetermined power level is based on a voltage or power requirement of one or more of the at least one electronic component.

4. The system of claim 1 wherein the battery check circuit comprises:
   a latch which is set to a first state in response to the system being turned on to provide power exclusively from the back-up supply node when the system is turned on.

5. The system of claim 4 wherein the latch which is reset to a second state when a signal indicating availability to the at least one electronic component of power from the battery is received by the latch, the battery check circuit disconnecting the back-up supply node from the battery check circuit when the latch is in a second state.

6. The system of claim 4 wherein power from the back-up battery is supplied to the at least one electronic component while the latch is in the first state, and wherein power from the back-up battery is disconnected from the at least one electronic component when the latch is in a second state.

7. A method comprising:
   powering, using a second battery, a battery check circuit for testing a power level of a first battery upon system startup regardless of a power state of the first battery;
   testing whether the power level of the first battery is less than a first level responsive to a stimulus that indicates application of power is desired but before power is provided;
   preventing the first battery from powering an electronic component if the power level is less than the first level; and
   enabling circuitry to provide power from the first battery to the electronic component if the power level is at least the first level.

8. The method of claim 7 further comprising:
   latching power from the second battery upon receiving said stimulus that indicates application of power is desired; and
   asserting a system shutdown signal prior to allowing power from the first battery to be applied to the electronic component.

9. The method of claim 7 wherein the first level is based on a safe voltage supply range for the electronic component.

10. The method of claim 7 further comprising:
    disconnecting power provided by the second battery from the battery check circuit after testing the power level of the first battery.

11. The method of claim 7 wherein powering the battery check circuit comprises:
    sensing an on button being depressed;
    enabling power to the battery check circuit;
    maintaining power to the battery check circuit while the power level of the first battery is tested.

12. A method comprising:
    powering, using a second battery, a battery check circuit for testing a power level of a first battery upon system startup regardless of a power state of the first battery, said powering the battery check circuit comprising:
    sensing an on button being depressed,
    enabling power to the battery check circuit, and
    maintaining power to the battery check circuit while the power level of the first battery is tested, wherein maintaining power to the battery check circuit comprises setting a latch which has its output coupled to enable a gate connecting the battery check circuit to the second battery;
    testing whether the power level of the first battery is less than a first level responsive to a stimulus that indicates application of power is desired but before power is provided;
    preventing the first battery from powering an electronic component if the power level is less than the first level; and
    enabling circuitry to provide power from the first battery to the electronic component if the power level is at least the first level.

13. The method of claim 12 wherein preventing the first battery from powering the electronic component comprises:
    maintaining the electronic component in a disconnected state from the first battery; and
    disabling the battery check circuit.

14. The method of claim 13 wherein disabling the battery check circuit comprises resetting the latch to disconnect the battery check circuit from the second battery.

15. A method comprising:
    receiving an enabling signal;
    latching power from a first battery responsive to the enabling signal;
    powering a test circuit from the first battery via the latch circuit;
    testing a charge level of a second battery via the test circuit; and
    asserting a shutdown signal if the charge level is less than a predetermined charge level.

16. The method of claim 15 further comprising:
    asserting a power supply enabling signal if the charge level is greater than or equal to the predetermined charge level.

17. The method of claim 15 further comprising:
    disconnecting the test circuit power from the first battery if the second battery has insufficient remaining power.

18. An apparatus comprising:
    a main battery, the main battery having a charge status;
    a backup battery;
    a plurality of system components;
    a power switch; and
    a battery check circuit that is, in response to actuation of the power switch, powered during a battery test interval exclusively by the backup battery, regardless of the charge status of the main battery, the battery check circuit to determine based on the charge status of the main battery whether to supply power from the main battery to the plurality of system components.

19. The apparatus of claim 18 wherein said apparatus is a portable computing device and wherein said plurality of system components includes a processor.

20. The apparatus of claim 18 further comprising a voltage regulator, wherein the battery check circuit enables the voltage regulator if the charge status of the main battery is at least a predetermined charge level.

21. The apparatus of claim 18 wherein the battery check circuit is to assert a power supply enabling signal if the charge status is greater than or equal to a predetermined charge level.

22. An apparatus comprising:
a main battery, the main battery having a charge status;
a backup battery;
a plurality of system components;
a power switch; and
a battery check circuit that is, in response to actuation of the power switch, powered during a battery test interval exclusively by the backup battery, regardless of the charge status of the main battery, the battery check circuit to determine based on the charge status of the main battery whether to supply power from the main battery to the plurality of system components, wherein the battery check circuit is to assert a power supply enabling signal if the charge status is greater than or equal to a predetermined charge level and otherwise to assert a shutdown signal prior to supplying power from the main battery to the plurality of system components.

23. The apparatus of claim 22 wherein the battery check circuit is to reset a latch to disconnect the battery check circuit and the backup battery if the main battery has insufficient remaining power.

* * * * *